US009966461B2

(12) United States Patent
Pfirsch et al.

(10) Patent No.: US 9,966,461 B2
(45) Date of Patent: May 8, 2018

(54) POWER SEMICONDUCTOR DEVICE

(71) Applicant: Infineon Technologies AG, Neubiberg (DE)

(72) Inventors: Frank Dieter Pfirsch, Munich (DE); Johannes Georg Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/716,583

(22) Filed: Sep. 27, 2017

(65) Prior Publication Data
US 2018/0097093 A1  Apr. 5, 2018

(30) Foreign Application Priority Data

Sep. 30, 2016  (DE) .................. 10 2016 219 020

(51) Int. Cl.
| H01L 27/02 | (2006.01) |
| H01L 29/739 | (2006.01) |
| H01L 29/06 | (2006.01) |
| H01L 29/66 | (2006.01) |
| H01L 29/10 | (2006.01) |

(52) U.S. Cl.
CPC ...... *H01L 29/7397* (2013.01); *H01L 29/0696* (2013.01); *H01L 29/1095* (2013.01); *H01L 29/66348* (2013.01)

(58) Field of Classification Search
CPC ............. H01L 29/7397; H01L 29/1095; H01L 29/0696; H01L 29/66348
See application file for complete search history.

(56) References Cited

U.S. PATENT DOCUMENTS

| 8,890,252 B2 | 11/2014 | Saikaku et al. | |
| 2009/0289690 A1* | 11/2009 | Hirler | H01L 29/4236 327/429 |
| 2016/0190123 A1 | 6/2016 | Laven et al. | |
| 2016/0352326 A1* | 12/2016 | Laven | H01L 27/0727 |
| 2017/0018548 A1* | 1/2017 | Laven | H01L 29/0834 |
| 2017/0018635 A1* | 1/2017 | Tsuyuki | H01L 29/7397 |
| 2017/0148786 A1* | 5/2017 | Matsushita | H01L 27/0664 |

FOREIGN PATENT DOCUMENTS

| DE | 10 2011 079 747 | 2/2012 |
| DE | 10 2014 119 543 | 6/2016 |
| JP | 2009-170670 | 7/2009 |

* cited by examiner

*Primary Examiner* — Victor A Mandala
(74) *Attorney, Agent, or Firm* — Dicke, Billig & Czaja, PLLC

(57) ABSTRACT

A power semiconductor device is disclosed. In one example, the device comprises a semiconductor body having a front side, a backside, a first load terminal, and a drift region. A first cell is arranged at the front side. Further, the power semiconductor device comprises: a first backside emitter region included in the semiconductor body, the first backside emitter region being electrically connected with the second load terminal and having dopants of the second conductivity type, wherein the first backside emitter region and the first cell have a first common lateral extension range; and a second backside emitter region included in the semiconductor body, the second backside emitter region being electrically connected with the second load terminal and having dopants of the first conductivity type, wherein the second backside emitter region and the second cell have a second common lateral extension range.

20 Claims, 13 Drawing Sheets

POWER SEMICONDUCTOR DEVICE

CROSS-REFERENCE TO RELATED APPLICATION

This Utility Patent Application claims priority to German Patent Application No. 10 2016 219 020.2, filed Sep. 30, 2016, which is incorporated herein by reference.

TECHNICAL FIELD

This specification refers to embodiments of a power semiconductor device and to embodiments of a method of processing a power semiconductor device. In particular, this specification refers to embodiments of a power semiconductor device having a reverse conduction capability and to embodiments of processing methods thereof.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

In some cases, the gate electrode may be included within a trench of the power semiconductor device, wherein the trench may exhibit, e.g., a stripe or closed polygonal cell configuration or a needle configuration.

Further, such trench occasionally includes more than only one electrode, e.g., two or more electrodes that are arranged separately from each other and sometimes also electrically insulated from each other. For example, a trench may comprise both a gate electrode and a field electrode, wherein the gate electrode can be electrically insulated from each of the load terminals, and wherein the field electrode can be electrically connected to one of the load terminals.

A power semiconductor device is usually configured to conduct a forward current along a forward current path between two load terminals of the device in a forward-conducting state. The load current path may be controlled by means of the first electrode, sometimes referred to as gate electrode. For example, upon receiving a corresponding control signal from, e.g., a driver unit, the gate electrode may set the power semiconductor device in one of the forward-conducting state and the forward-blocking state.

Occasionally, such a power semiconductor device is further configured to conduct the reverse current between the two load terminals in a direction opposite to the one of the forward current. For example, in the case of reverse conducting IGBTs (RC-IGBTs), such a reverse conduction capability may be realized by providing a reverse-conducting path via a body diode included in the semiconductor body that is forward-biased in the reverse-conducting state of the semiconductor device.

It is generally desirable to keep switching losses that occur upon switching of such devices between the reverse-conducting state and the forward-conducting state low. To this end, it may be desirable to keep an emitter efficiency, e.g. an anode emitter efficiency, of the body diode of the device comparatively low in the reverse-conducting state.

SUMMARY

According to an embodiment, a power semiconductor device comprises: a semiconductor body having a front side and a backside; a first load terminal being arranged at the front side and a second load terminal being arranged at the backside; and a drift region being included in the semiconductor body and having dopants of the first conductivity type. Further, the power semiconductor device comprises a first cell being arranged at the front side and comprising: a first source region being electrically connected with the first load terminal; a first body region included in the semiconductor body, the first body region having dopants of a second conductivity type complementary to the first conductivity type and isolating the first source region from the drift region; and a first electrode being electrically connected with a first control terminal of the semiconductor device and being configured to induce a first inversion channel in a first channel region extending inside the first body region from the first source region to the drift region. The power semiconductor device further includes a second cell being arranged at the front side and comprising: a second source region included in the semiconductor body, the second source region having dopants of the first conductivity type and being electrically connected with the first load terminal; a second body region included in the semiconductor body, the second body region having dopants of the second conductivity type and isolating the second source region from the drift region; and a second electrode being electrically insulated from the first control terminal of the semiconductor device and being configured to induce a second inversion channel in a second channel region extending inside the second body region from the second source region to the drift region. The semiconductor body further includes: a first backside emitter region being electrically connected with the second load terminal and having dopants of the second conductivity type, wherein the first backside emitter region and the first cell have a first common lateral extension range; and a second backside emitter region being electrically connected with the second load terminal and having dopants of the first conductivity type, wherein the second backside emitter region and the second cell have a second common lateral extension range. The first conductivity type is n-type and the first inversion channel is formed if a voltage larger than a positive first threshold voltage is present between the first electrode and the first body region, and the second inversion channel is formed if a voltage larger than a positive second threshold voltage is present between the second electrode and the second body region, the second threshold voltage being smaller than the first threshold voltage. Or, the first conductivity type is p-type and the first inversion channel is formed if a voltage smaller than a negative first threshold voltage is present between the first electrode and the first body region, and the second inversion channel is formed if a voltage smaller than a negative second threshold voltage is present between the second electrode and the second body region, the second threshold voltage being larger than the first threshold voltage.

According to a further embodiment, a power semiconductor device comprises: a semiconductor body having a front side and a backside; a first load terminal being arranged at the front side and a second load terminal being arranged at the backside; and a drift region being included in the semiconductor body and having dopants of the first conductivity type. Further, the power semiconductor device comprises a first cell being arranged at the front side and comprising: a first source region being electrically connected with the first load terminal; a first body region included in the semiconductor body, the first body region having dopants of a second conductivity type complementary to the first conductivity type and isolating the first source region from the drift region; and a first electrode being electrically connected with a first control terminal of the semiconductor device and being configured to induce a first inversion channel in a first channel region extending inside the first body region from the first source region to the drift region. The power semiconductor device further includes a second cell being arranged at the front side and comprising: a second source region being electrically connected with the first load terminal; a second body region included in the semiconductor body, the second body region having dopants of the second conductivity type and isolating the second source region from the drift region; and a second electrode being electrically insulated from the first control terminal of the semiconductor device and being configured to induce a second inversion channel in a second channel region extending inside the second body region from the second source region to the drift region. The semiconductor body further includes: a first backside emitter region being electrically connected with the second load terminal and having dopants of the second conductivity type, wherein the first backside emitter region and the first cell have a first common lateral extension range; and a second backside emitter region being electrically connected with the second load terminal and having dopants of the first conductivity type, wherein the second backside emitter region and the second cell have a second common lateral extension range. Further, the drift region comprises a barrier region having dopants of the first conductivity type being arranged in the vicinity of the second body region, wherein a dopant concentration of the barrier region is higher than a dopant concentration of a portion of the drift region that is adjacent to the barrier region. The first conductivity type is n-type and the first inversion channel is formed if a voltage larger than a positive first threshold voltage is present between the first electrode and the first body region, and the second inversion channel is formed if a voltage larger than a positive second threshold voltage is present between the second electrode and the second body region, the second threshold voltage being smaller than the first threshold voltage. Or, the first conductivity type is p-type and the first inversion channel is formed if a voltage smaller than a negative first threshold voltage is present between the first electrode and the first body region, and the second inversion channel is formed if a voltage smaller than a negative second threshold voltage is present between the second electrode and the second body region, the second threshold voltage being larger than the first threshold voltage.

According to another embodiment, a method of processing a power semiconductor device comprises: providing a semiconductor body to be coupled to each of a first load terminal being arranged at the front side of the semiconductor body and a second load terminal being arranged at the backside of the semiconductor body; forming in the semiconductor body a drift region having dopants of a first conductivity type; and forming a first cell being arranged at the front side, wherein the first cell comprises: a first source region being electrically connected with the first load terminal; a first body region included in the semiconductor body, the first body region having dopants of a second conductivity type complementary to the first conductivity type and isolating the first source region from the drift region; and a first electrode being electrically connected with the first control terminal of the semiconductor device and being configured to induce a first inversion channel in a first channel region extending inside the first body region from the first source region to the drift region. The method further comprises forming a second cell being arranged at the front side, wherein the second cell comprises: a second source region included in the semiconductor body, the second source region having dopants of the first conductivity type and being electrically connected with the first load terminal; a second body region included in the semiconductor body, the second body region having dopants of the second conductivity type and isolating the second source region from the drift region; and a second electrode being electrically insulated from the first control terminal of the semiconductor device and being configured to induce a second inversion channel in a second channel region extending inside the second body region from the second source region to the drift region. The method further comprises forming in the semiconductor body a first backside emitter region being electrically connected with the second load terminal and having dopants of the second conductivity type, wherein the first backside emitter region and the first cell have a first common lateral extension range; and forming in the semiconductor body a second backside emitter region being electrically connected with the second load terminal and having dopants of the first conductivity type, wherein the second backside emitter region and the second cell have a second common lateral extension range. The first conductivity type is n-type and the first inversion channel is formed if a voltage larger than a positive first threshold voltage is present between the first electrode and the first body region, and the second inversion channel is formed if a voltage larger than a positive second threshold voltage is present between the second electrode and the second body region, the second threshold voltage being smaller than the first threshold voltage. Or, the first conductivity type is p-type and the first inversion channel is formed if a voltage smaller than a negative first threshold voltage is present between the first electrode and the first body region, and the second inversion channel is formed if a voltage smaller than a negative second threshold voltage is present between the second electrode and the second body region, the second threshold voltage being larger than the first threshold voltage.

According to a yet further embodiment, a method of processing a power semiconductor device comprises: providing a semiconductor body to be coupled to each of a first load terminal being arranged at the front side of the semiconductor body and a second load terminal being arranged at the backside of the semiconductor body; forming in the semiconductor body a drift region having dopants of a first conductivity type; and forming a first cell being arranged at the front side, wherein the first cell comprises: a first source region being electrically connected with the first load terminal; a first body region included in the semiconductor body, the first body region having dopants of a second conductivity type complementary to the first conductivity type and isolating the first source region from the drift region; and a first electrode being electrically connected with the first control terminal of the semiconductor device and being configured to induce a first inversion channel in a first channel region extending inside the first body region from the first source region to the drift region. The method further comprises forming a second cell being arranged at the front side, wherein the second cell comprises: a second source region being electrically connected with the first load terminal; a second body region included in the semiconductor body, the second body region having dopants of the second conductivity type and isolating the second source region from the drift region; and a second electrode being electrically insulated from the first control terminal of the semiconductor device and being configured to induce a second inversion channel in a second channel region extending inside the second body region from the second source region to the drift region. The method further comprises forming in the semiconductor body a first backside emitter region being electrically connected with the second load terminal and having dopants of the second conductivity type, wherein the first backside emitter region and the first cell have a first common lateral extension range; and forming in the semiconductor body a second backside emitter region being electrically connected with the second load terminal and having dopants of the first conductivity type, wherein the second backside emitter region and the second cell have a second common lateral extension range. The method further comprises providing in the drift region a barrier region having dopants of the first conductivity type and being arranged in the vicinity of the second body region, wherein a dopant concentration of the barrier region is higher than a dopant concentration of a portion of the drift region that is adjacent to the barrier region. The first conductivity type is n-type and the first inversion channel is formed if a voltage larger than a positive first threshold voltage is present between the first electrode and the first body region, and the second inversion channel is formed if a voltage larger than a positive second threshold voltage is present between the second electrode and the second body region, the second threshold voltage being smaller than the first threshold voltage. Or, the first conductivity type is p-type and the first inversion channel is formed if a voltage smaller than a negative first threshold voltage is present between the first electrode and the first body region, and the second inversion channel is formed if a voltage smaller than a negative second threshold voltage is present between the second electrode and the second body region, the second threshold voltage being larger than the first threshold voltage.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
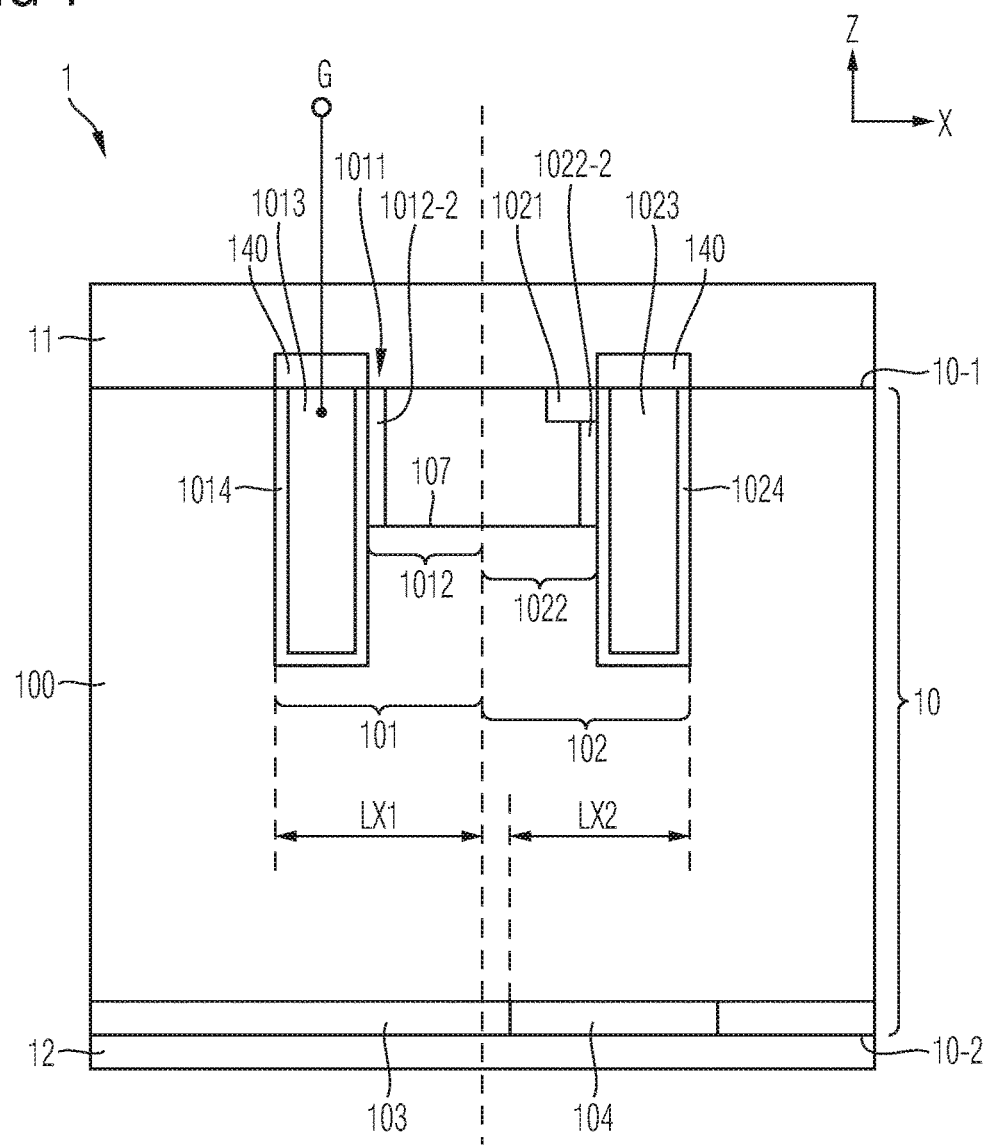
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration or a closed polygonal cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS-gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged within an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V. For example, the processed semiconductor device described below may be a semiconductor device exhibiting a stripe cell configuration or a closed polygonal cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIGS. 1 to 13 each schematically and exemplarily illustrate a section of a vertical cross-section of a power semiconductor device 1 in accordance with some embodiments. The following description generally refers to each of FIGS. 1 to 13. Certain features of exemplary embodiments will be explained in more detail with explicit reference to one or more of FIGS. 1 to 13.

The illustrated cross-sections are in parallel to a plane defined by a first lateral direction X and a vertical direction Z. Each of the illustrated components of the power semiconductor device 1 may extend along a second lateral direction Y.

The power semiconductor device 1 comprises a semiconductor body 10, e.g., based on silicon or silicon carbide. Other possible semiconductor materials are mentioned further below. The semiconductor body 10 is coupled to each of the first load terminal 11 and the second load terminal 12 of the power semiconductor device 1. For example, the first load terminal 11 comprises a first metallization, and the second load terminal 12 may comprise a second metallization. The power semiconductor device 1 may exhibit a vertical set-up, according to which the semiconductor body 10 is sandwiched between the first load terminal 11 and the second load terminal 12. The first load terminal at 11 may be arranged at the front side 10-1 of the semiconductor body 10, and the second load terminal 12 may be arranged at a backside 10-2 of the semiconductor body 10. Accordingly, said first metallization of the first load terminal 11 can be a front side metallization, and said second metallization of the second load terminal 12 can be a backside metallization. For example, by means of these terminals 11 and 12, the power semiconductor device 1 receives and outputs a load current. Accordingly at least one of these terminals 11 and 12, e.g., the first load terminal 11, can include one or more bonding pads (not illustrated) so as to interface, e.g., with a number of bond wires.

The semiconductor body 10 includes a drift region 100 with dopants of the first conductivity type. For example, the drift region 100 is an n$^-$-doped region. Further, the dopant concentration and the total extension of the drift region 100 along the vertical direction Z may essentially determine a blocking capability, i.e., a maximum blocking voltage of the power semiconductor device 1. For example, the blocking voltage is greater than 500 V, greater than 1 kV, or even greater than 1.5 kV.

Further, one or more first cells 101 are arranged at the front side 101. The cells 101 may be configured to control a current flow between the first load terminal 11 and the second load terminal 12. For example, the first cell 101 may take the form of a MOS control head.

Each first cell 101 comprises a first source region 1011 that is electrically connected with the first load terminal 11. The first source region 1011 may be included in the semiconductor body 10 and may have dopants of the first conductivity type, e.g. n-type, as exemplarily depicted in FIGS. 5 to 13. For example, the first source region 1011 comprises dopants of the first conductivity type (such as n-type) at a higher dopant concentration than the drift region 100. In other embodiments, the first source region 1011 may be formed, e.g., by means of a metal that is in contact with the semiconductor body 10, such as by a metal-to-semiconductor transition formed at a transition from a portion of the first load terminal 11 and the semiconductor body 10 (see FIGS. 1 to 4). The semiconductor body 10 may be configured to receive and/or output a load current from and/or to the first load terminal 11 via the first source region 1011.

Further, each first cell 101 comprises a first body region 1012 included in the semiconductor body 10. The first body region 1012 has dopants of a second conductivity type complementary to the first conductivity type. For example, the first body region 1012 has p-type dopants if the drift region 100 and the first source region 1011 have n-type dopants. The first body region 1012 is arranged so as to isolate the first source region 1011 from the drift region 100.

In an embodiment, the first body region 1012 is electrically connected with the first load contact 11 (see FIGS. 1 to 13).

For example, a pn-junction 107 is formed at a transition between the first body region 1012 and the drift region 100. The pn-junction 107 may be configured to block a blocking voltage in a blocking state of the power semiconductor device 1.

For controlling a forward current path through the power semiconductor device 1 between the first load terminal 11 and the second load terminal 12, each first cell 101 further comprises a first electrode 1013 (also referred to as gate electrode) that is electrically connected with a first control terminal G (also referred to as gate terminal) of the power semiconductor device 1. For example, the first electrode 1013 may be insulated from the first load terminal 11, such as by means of an insulating block 140. For example, the insulating block 140 comprises a dielectric material such as an oxide, e.g., a silicon dioxide. The first electrode 1013 is arranged and configured to induce a first inversion channel in a first channel region 1012-2, wherein the first channel region 1012-2 extends inside the first body region 1012 from the first source region 1011 to the drift region 100. For example, the first electrode 1013 is configured to induce said first inversion channel in dependence on an external voltage signal provided at the first control terminal G.

In an embodiment, the at least one first electrode 1013 is accommodated in a respective trench that is provided in the semiconductor body 10. For instance, the trench comprises a first insulation layer 1014 that insulates the first electrode 1013 from the first channel region 1012-2. The first insulation layer 1014 may comprise a gate dielectric, such as an oxide. For example, such a trench extends from the front side 10-1 into the semiconductor body 10 essentially along the vertical direction Z, as depicted in FIGS. 1 to 13.

Opposite to said cell 101 being arranged at the front side 10-1, at least one first backside emitter region 103 is provided in the semiconductor body 10 at the back side 10-2. The first backside emitter region 103 is electrically connected with the second load terminal 12 (e.g. a backside metallization 12) and comprises dopants of the second conductivity type. For example, the first backside emitter region 103 may be realized as a pt-doped semiconductor region if the drift region 100 is n-doped, such as in the case of an n-channel IGBT. The first backside emitter region 103 may be configured to inject charge carriers of the second conductivity type into the drift region 100 in a forward-conducting state of the power semiconductor device 1. Thus, a bipolar forward-conducting mode may be realized, as is well known from IGBTs.

The first backside emitter region 103 and the first cell 101 exhibit a first common lateral extension range LX1 along the first lateral direction X. In other words, there is a finite lateral overlap LX1 along the first lateral direction X between the first cell 101 at the front side 10-1 and the first backside emitter region 103 at the backside 10-2. For example, the first common lateral extension range LX1 amounts to at least 10%, at least 30%, at least 50%, or even 100% of a total lateral extension of the first cell 101 along the first lateral direction X. For example, in case there are a plurality of first cells 101 and/or a plurality of first backside emitter regions 103 provided in the semiconductor device 1, the sum of the respective first common lateral extension ranges LX1 of each cell 101 with a first backside emitter region 103 may amount to at least 10%, at least 30%, or even at least 50% of the sum of the total lateral extensions of all first cells 101 along the first lateral direction X.

Further, in addition to the at least one first backside emitter region 103, at least one second backside emitter region 104 is provided in the semiconductor body 10. The second backside emitter region 104 is electrically connected with the second load terminal 12 and has dopants of the first conductivity type. For example, the power semiconductor device 1 is a reverse conducting IGBT (RC-IGBT), wherein the at least one second backside emitter region 104 is a short region, such as an n-short region, arranged at the backside 10-2 so as to allow for a reverse conducting diode operation of the RC-IGBT 1.

For example, the back side 10-2 of the semiconductor body 10 exhibits one or more first backside emitter regions 103 functioning as "IGBT regions" and one or more second backside emitter regions 104 functioning as "diode regions" so as to allow for both IGBT operation in a forward-conducting state and diode operation in a reverse-conducting state of the power semiconductor device 1.

Opposite to the at least one second backside emitter region 104, at least one second cell 102 is arranged at the front side 10-1 of the semiconductor body 10. For example, the at least one second cell 102 is arranged and configured to influence a reverse current path between the second load terminal 12 and the first load terminal 11 in a reverse conducting state of the power semiconductor device 1, wherein a voltage is applied between the load terminals 11 and 12 such that the pn-junction 107 is forward biased. Such a configuration is sometimes referred to as MOS-gated diode (MGD).

Each second cell 102 comprises a second source region 1021 that is electrically connected with the first load terminal 11. The second source region 1021 may be included in the semiconductor body 10 and may have dopants of the first conductivity type, e.g. n-type, as exemplarily depicted in FIG. 1, FIGS. 5 to 10, and FIG. 12. For example, the second source region 1021 comprises dopants of the first conductivity type (such as n-type) at a higher dopant concentration than the drift region 100. In other embodiments, the first source region 1021 may be formed, e.g., by means of a metal that is in contact with the semiconductor body 10, such as by a metal-to-semiconductor transition formed at a transition from a portion of the first load terminal 11 and the semiconductor body 10 (see FIGS. 1 to 4 and FIG. 11).

Further, each second cell 102 comprises a second body region 1022 included in the semiconductor body 10. The second body region 1022 has dopants of the second conductivity type. For example, the second body region 1012 has p-type dopants if the drift region 100 and the first and second source regions 1011, 1021 have n-type dopants. The second body region 1022 is arranged so as to isolate the second source region 1021 from the drift region 100.

In an embodiment, the second body region 1022 is electrically connected with the first load contact 11 (see FIGS. 1 to 13).

For example, said pn-junction 107 that is configured to block a blocking voltage in a blocking state of the power semiconductor device 1 is also formed at a transition between the second body region 1022 and the drift region 100.

In an embodiment, the second body region 1022 and the first body region 1021 may be in contact with each other. For example, each of the second body region 1022 and the first body region 1021 may be formed by different portions of a common body region, as depicted in FIGS. 1 to 13. In another embodiment, the second body region 1022 may be separated from the first body region 1021, e.g., by one or more trenches provided in the semiconductor body 10.

Each second cell 102 further comprises a second electrode 1023 (also referred to as MGD-electrode). The second electrode 1023 is electrically insulated from the control terminal G of the power semiconductor device 1.

Figure 6:
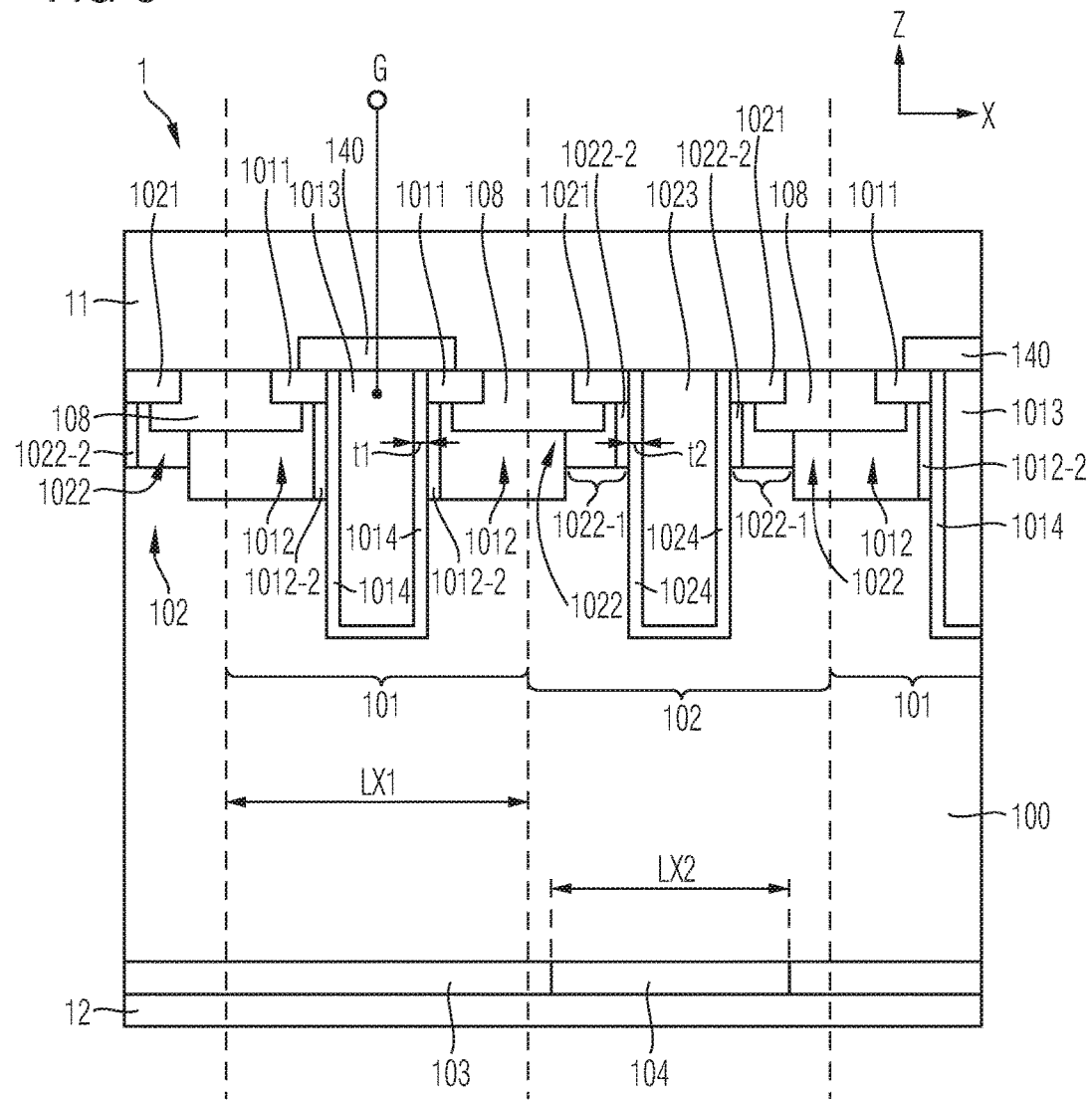
FIG. 6 schematically and exemplarily illustrates a section of a vertical cross-section of a power semiconductor device in accordance with one or more embodiments.
Figure 7:
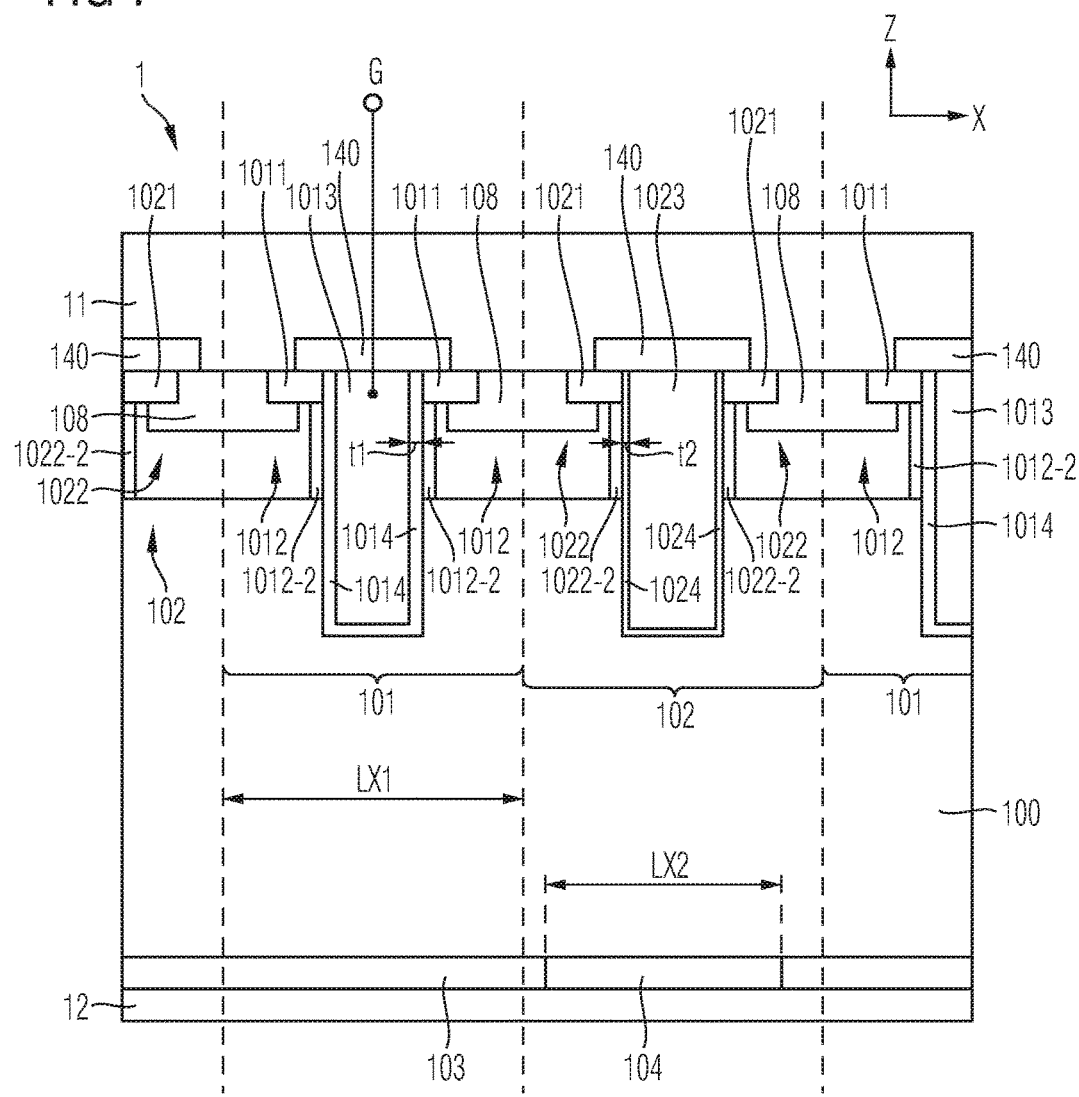
FIG. 7 schematically and exemplarily illustrates a section of a vertical cross-section of a power semiconductor device in accordance with one or more embodiments.
Figure 11:
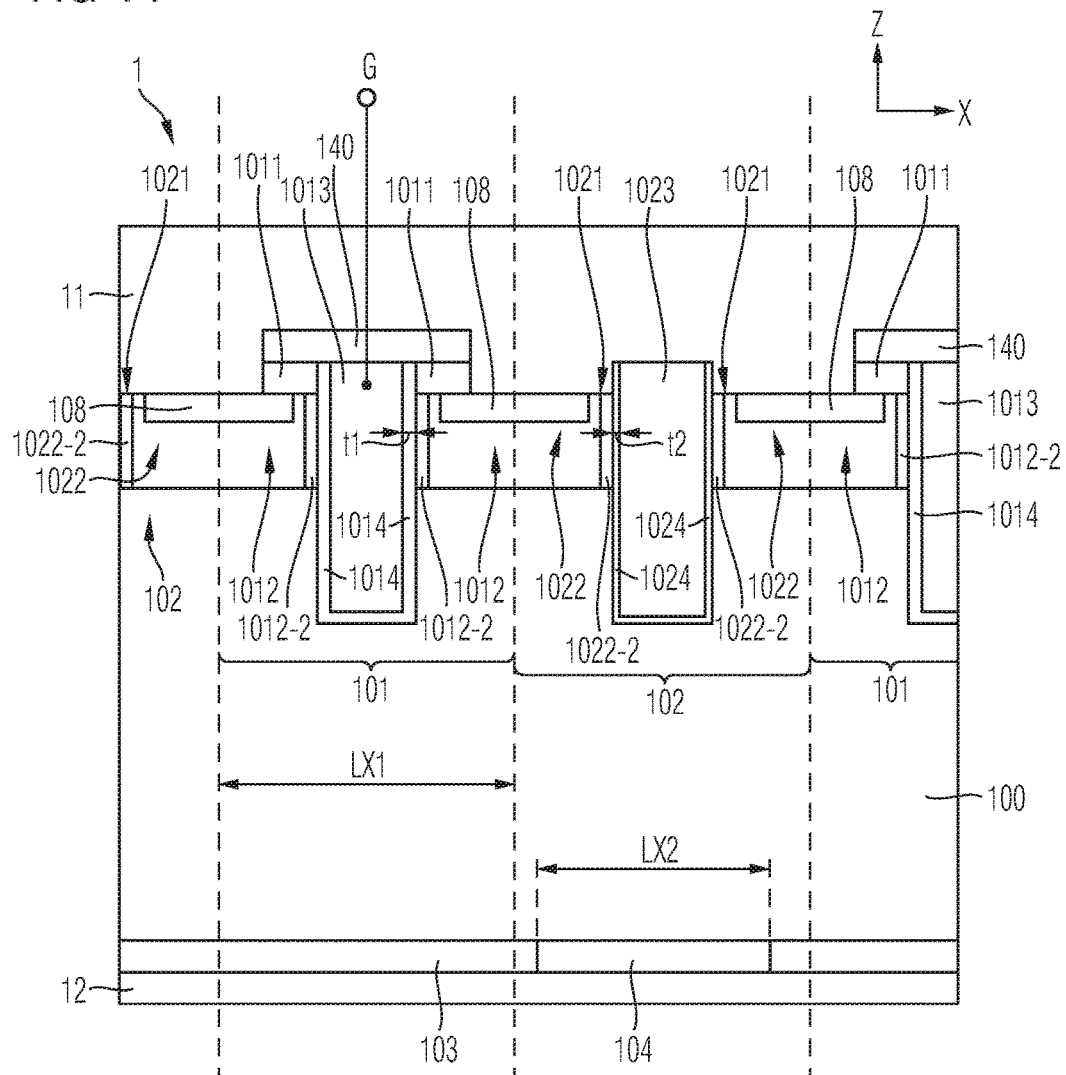
FIG. 11 schematically and exemplarily illustrates a section of a vertical cross-section of a power semiconductor device in accordance with one or more embodiments.

In an embodiment, the second electrode 1023 is electrically connected with the first load terminal 11 (see, e.g., FIG. 6 and FIG. 11). For example, with reference to FIG. 6, the second electrode 1023 may be in direct contact with a front side metallization that forms at least a part of the first load terminal 11.

In an alternative embodiment, the power semiconductor device 1 further comprises a second control terminal being electrically insulated from each of the first load terminal 11, the second load terminal 12, and the first control terminal G, wherein the second electrode 1023 is electrically connected with the second control terminal.

For example, the power semiconductor device 1 exhibits a MOS-gated diode (MGD) configuration, wherein the second electrode 1023 is configured to influence a reverse current path through the power semiconductor device 1 between the second load terminal 12 and the first load terminal 11.

In an embodiment, the second electrode 1023 is arranged and configured to induce a second inversion channel in a second channel region 1022-2, the second channel region 1022-2 extending inside the second body region 1022 from the second source region 1021 to the drift region 100.

For example, the second electrode 1023 is configured to induce said second inversion channel in dependence on an external voltage signal provided at a second control terminal (not depicted).

In an embodiment, the second electrode 1023 is accommodated in a respective trench that is provided in the semiconductor body 10. For instance, the trench comprises a second insulation layer 1024 that insulates the second electrode 1023 from the second channel region 1022-2. The second insulation layer 1024 may comprise a gate dielectric, such as an oxide. For example, such a trench extends from the front side 10-1 into the semiconductor body 10 essentially along the vertical direction Z, as depicted in FIGS. 1 to 13.

With reference to FIG. 11, in an embodiment, the second channel region 1022-2 may be arranged in direct contact with the first load terminal 11. Thus, for example, a front side metallization that forms at least a part of the first load terminal 11 may be in contact with the second channel region 1022-2 of the second body region 1022 without, e.g., a semiconductor source region being arranged there between.

The at least one second backside emitter region 104 and the at least one second cell 102 exhibit a second common lateral extension range LX2 along the first lateral direction X. In other words, there is a finite lateral overlap LX2 along the first lateral direction X between the second cell 102 at the front side 10-1 and the second backside emitter region 104 at the backside 10-2. For example, the second common lateral extension range LX2 amounts to at least 10%, at least 30%, at least 50%, or even 100% of a total lateral extension of the second cell 102 along the first lateral direction X. For example, in case there are a plurality of second cells 102 and/or a plurality of second backside emitter regions 104 provided in the semiconductor device 1, the sum of the respective second common lateral extension ranges LX2 of each second cell 102 with a second backside emitter region 104 may amount to at least 10%, at least 30%, or even at least 50% of the sum of the total lateral extensions of all second cells 102 along the first lateral direction X.

Figure 3:
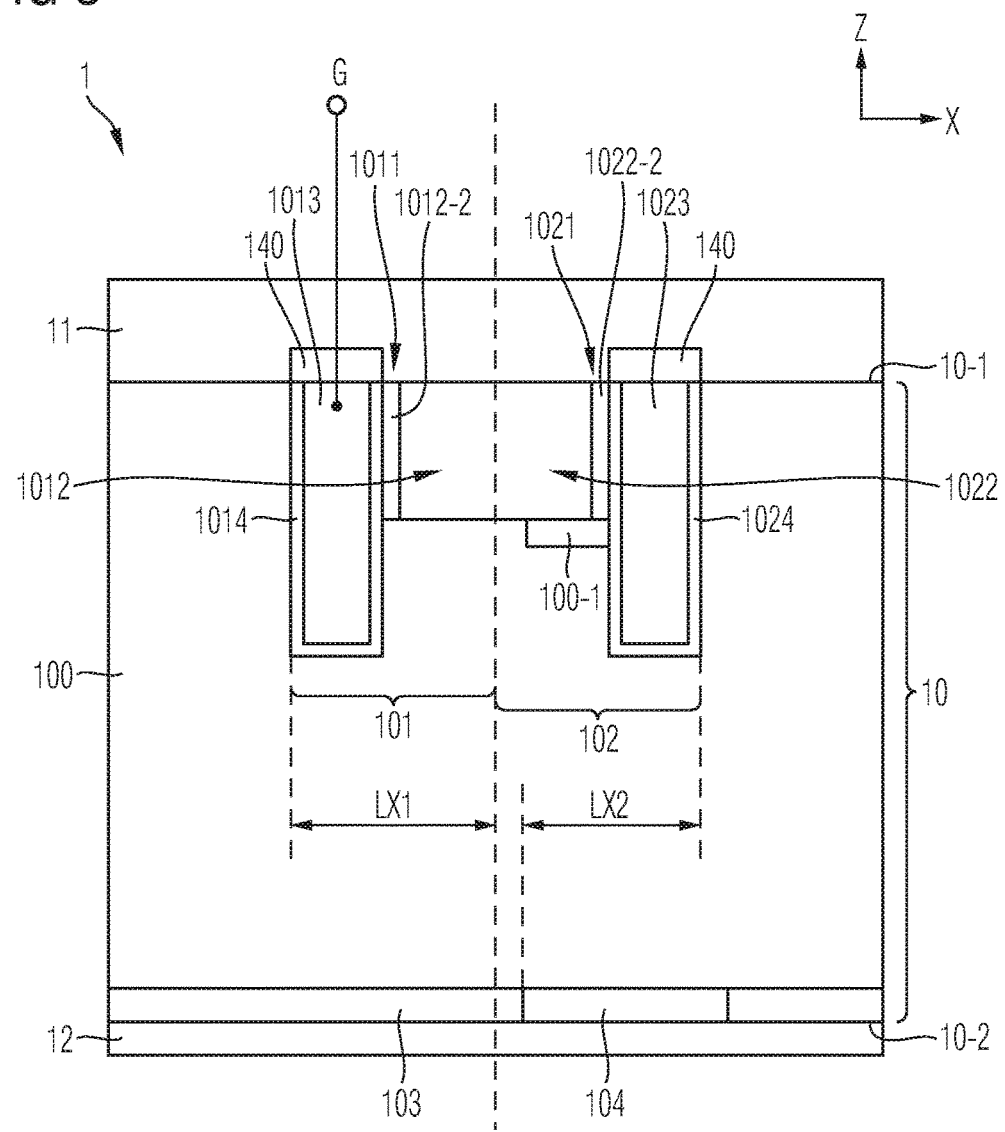
FIG. 3 schematically and exemplarily illustrates a section of a vertical cross-section of a power semiconductor device in accordance with one or more embodiments.
Figure 4:
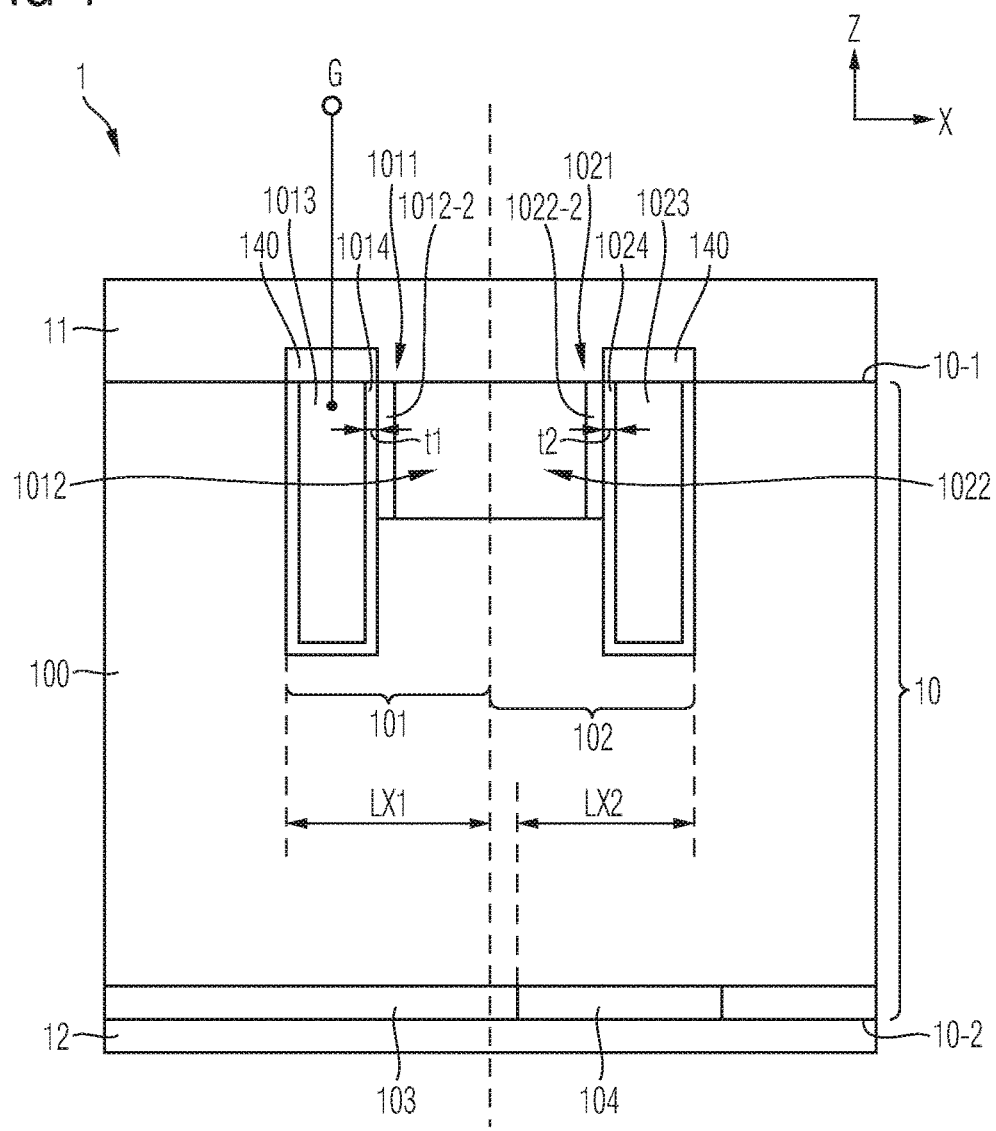
FIG. 4 schematically and exemplarily illustrates a section of a vertical cross-section of a power semiconductor device in accordance with one or more embodiments.
Figure 8:
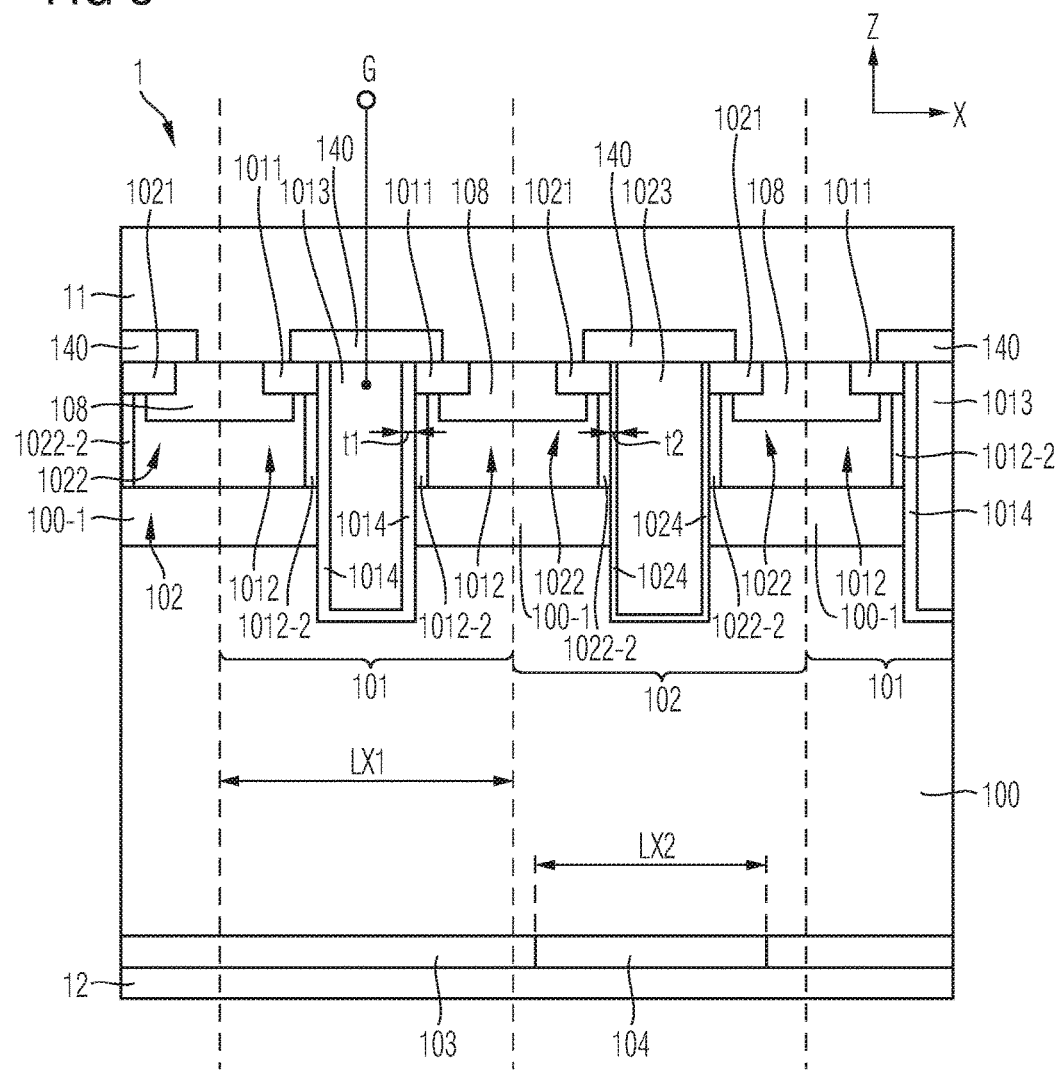
FIG. 8 schematically and exemplarily illustrates a section of a vertical cross-section of a power semiconductor device in accordance with one or more embodiments.
Figure 9:
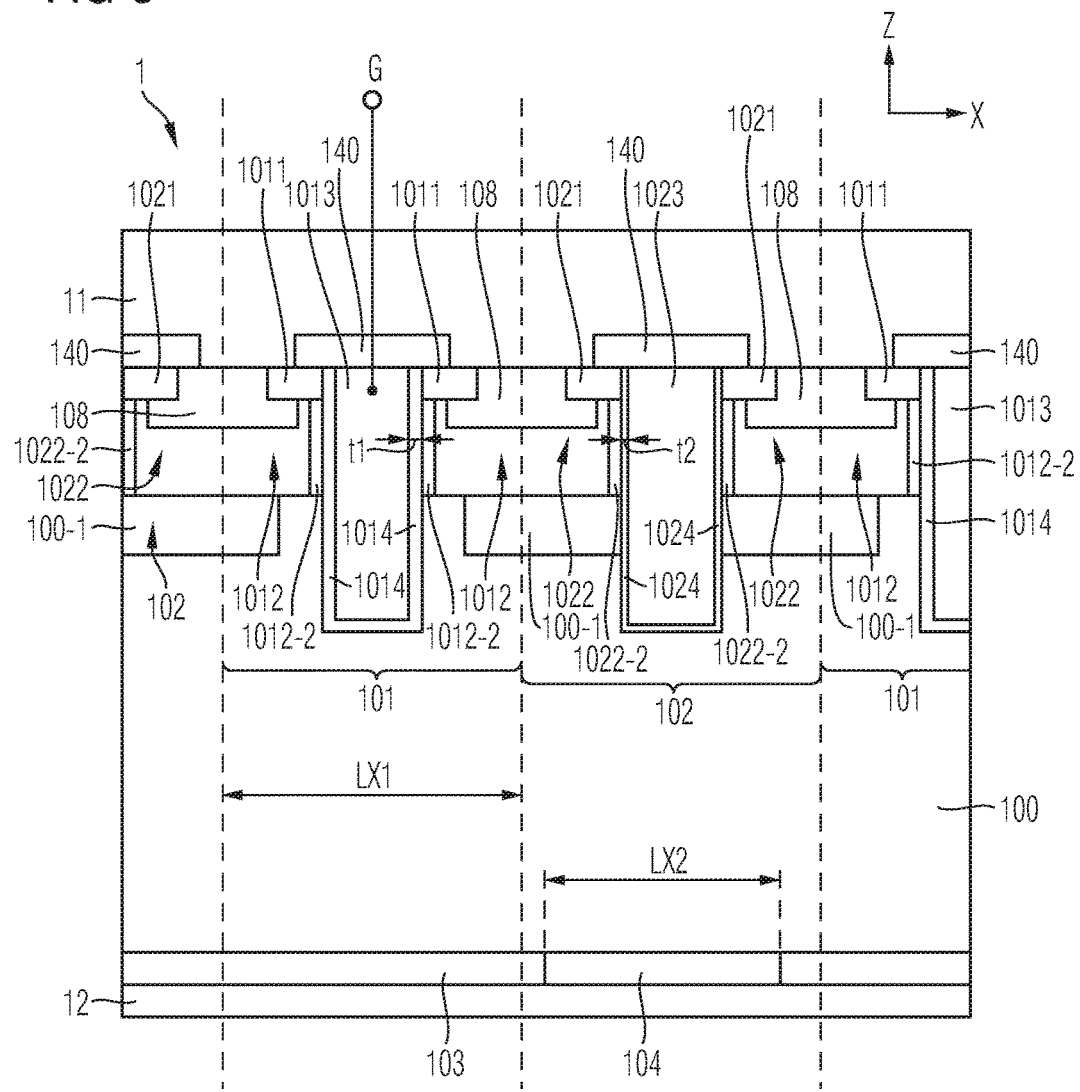
FIG. 9 schematically and exemplarily illustrates a section of a vertical cross-section of a power semiconductor device in accordance with one or more embodiments.

Referring to the embodiments in accordance with FIGS. 3, 8, and 9, the drift region 100 can comprise a barrier region 100-1 having dopants of the first conductivity type and being arranged in contact with the second body region 1022. It should be noted that in other embodiments, the barrier region 100-1 may be arranged in the vicinity of the second body region 1022 without being in contact with said second body region 1022. In an embodiment, the barrier region 100-1 may be arranged "in the vicinity" of the second body region 1022 in the sense that a minimal distance between the barrier region 100-1 and the second body region 1022 is smaller than a minimal distance between the barrier region 100-1 and each of the first backside emitter region 103 and the second backside emitter region 104. For example, said minimal distance between the barrier region 100-1 and the second body region 1022 is smaller than a minimal distance between the barrier region 100-1 and each of the first backside emitter region 103 and the second backside emitter region 104 by a factor of at least 3, such as by a factor of at least 5 or even by a factor of at least 10. A dopant concentration of the barrier region 100-1 may be higher than a dopant concentration of a portion of the drift region 100 external of the barrier region 100-1. For example, a dopant concentration in the barrier region 100-1 may be larger than $10^{15}$ cm$^{-3}$, such as up to about $10^{17}$ cm$^{-3}$. The dopant concentration in a portion of the drift region 100 may be, e.g., in the range from $10^{12}$ cm$^{-3}$ to $10^{14}$ cm$^{-3}$, such as several $10^{13}$ cm$^{-3}$. In other words, the drift region 100 may comprise an increase in the concentration of dopants of the first conductivity type towards the second body region 1022 by at least a factor of 10, such as at least a factor of $10^2$, at least a factor of $10^3$, or even at least a factor of $10^4$.

For example, the dopant concentration of the barrier region 100-1 may be higher than the dopant concentration of said portion of the drift region 100 that is adjacent to the barrier region 100-1 at least by a factor of 100, such as by a factor of 1000, or even at least by a factor of $10^4$.

As illustrated in FIGS. 3, 8, and 9, the barrier region 100-1 may extend along all or only a portion of the pn-junction 107 formed at the transition between the drift region 100 and the first and second body regions 1012, 1022. In the embodiments in accordance with FIGS. 3 and 9, the barrier region 100-1 does not extend along at least a portion of the pn-junction 107 formed at the transition between the drift region 100 and the first body region 1012.

For example, the barrier region 100-1 is arranged and configured to reduce an emitter efficiency, such as an anode efficiency, of the body diode formed by at least the second body region 1012 and the drift region 100 in the reverse conducting state of the power semiconductor device 1.

In an embodiment, the first conductivity type is n-type and the first inversion channel is formed if a voltage larger than a positive first threshold voltage is present between the first electrode 1013 and the first body region 1012, and wherein the second inversion channel is formed if a voltage larger than a positive second threshold voltage is present between the second electrode 1023 and the second body region 1022, wherein the second threshold voltage is smaller than the first threshold voltage.

In another embodiment, the first conductivity type is p-type and the first inversion channel is formed if a voltage smaller than a negative first threshold voltage is present between the first electrode 1013 and the first body region 1012, and wherein the second inversion channel is formed if a voltage smaller than a negative second threshold voltage is present between the second electrode 1023 and the second body region 1022, wherein the second threshold voltage is larger than the first threshold voltage.

In an embodiment, the absolute value of the second threshold voltage may be equal to or smaller than a diffusion voltage of the pn-junction 107 formed at the transition between the drift region 100 and at least one of the first body region 1012 and the second body region 1022.

For example, the absolute value of the second threshold voltage may be equal to or smaller than 3 V, such as smaller than 1 V, or even smaller than 0.5 V.

For example, the absolute value of said first threshold voltage may be at least in part determined by a work function of the first electrode 1013 and/or the absolute value of said second threshold voltage may be at least in part determined work function of the second electrode 1023. For example, the first electrode 1013 comprises a material having a work function that is different from a work function of a material of the second electrode 1023 so as to ensure that the absolute value of the second threshold voltage is smaller than the absolute value of the first threshold voltage.

Further, the absolute value of said first threshold voltage may be at least in part determined by a capacitance per unit area between the first electrode 1013 and the first body region 1012 and/or the absolute value of said second threshold voltage may be at least in part determined by a capacitance per unit area between the second electrode 1023 and the second body region 1022.

In embodiment, the capacitance per unit area between the second electrode 1023 and the second body region 1022 may be larger than the capacitance per unit area between the first electrode 1013 and the first body region 1012. For example, the capacitance per unit area between the second electrode 1023 and the second body region 1022 is larger than the capacitance per unit area between the first electrode 1013 and the first body region 1012 at least by a factor of 1.5, such as at least by a factor of 3, at least by a factor of 5, or even at least by a factor of 10.

Further, in an embodiment, the first electrode 1013 is insulated from the first channel region 1012-2 by a first insulation layer 1014 and the second electrode 1023 is insulated from the second channel region 1022-2 by a second insulation layer 1024. For example, the first insulation layer 1014 and/or the second insulation layer 1024 comprises a gate dielectric, such as an oxide.

In a variant, the first insulation layer 1014 may have a first permittivity and the second insulation layer 1024 may have a second permittivity, wherein the second permittivity is larger than the first permittivity. For example, the second permittivity is larger than the first permittivity at least by a factor of 1.5, such as at least by a factor of 3, at least by a factor of 5, or even at least by a factor of 10.

Further, as illustrated in FIGS. 4 and FIGS. 7 to 11, the first insulation layer 1014 may have a first thickness t1 and the second insulation layer 1024 may have a second thickness t2, wherein the second thickness t2 may be smaller than the first thickness t1. For example, the second thickness t2 may amount to at most 50%, such as at most 25%, at most 10%, or even only at most 5% of the first thickness t1.

Figure 2:
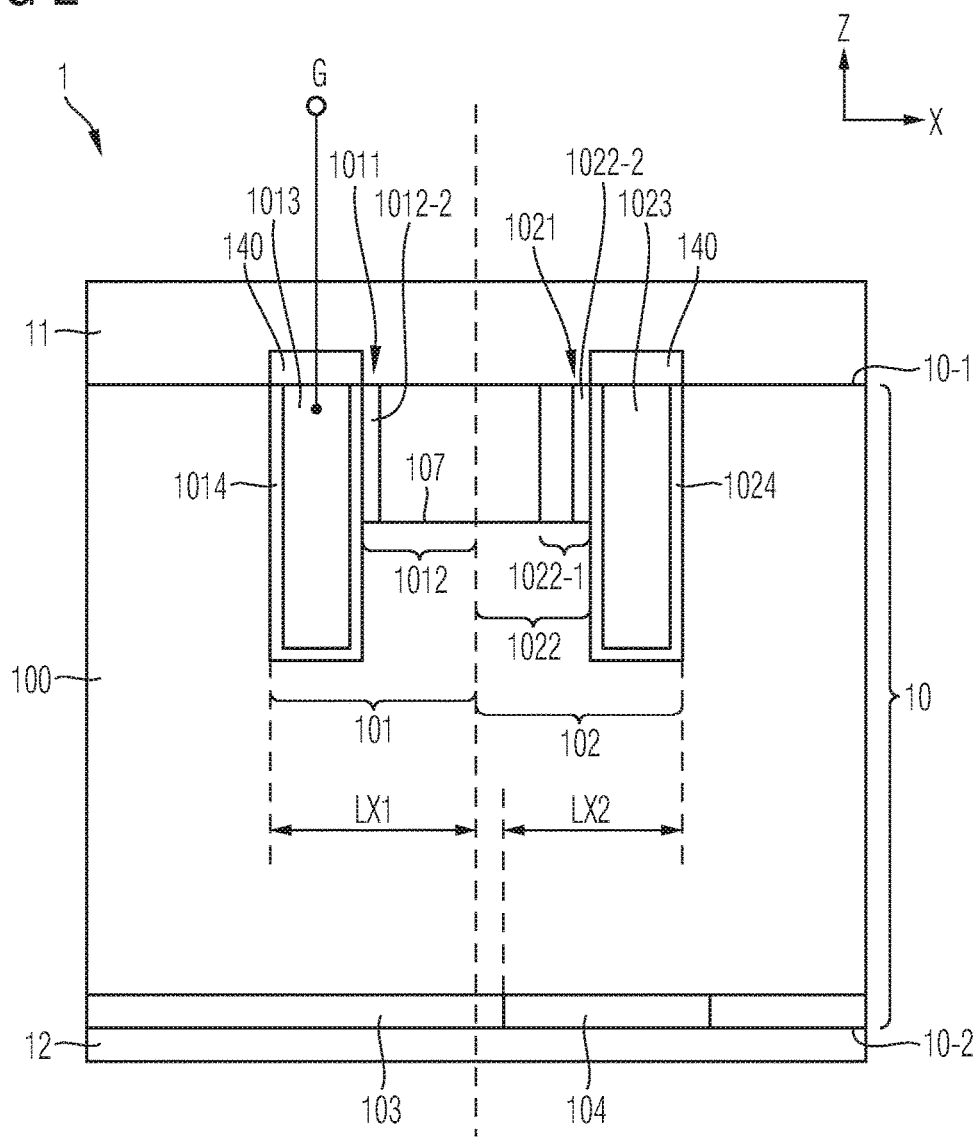
FIG. 2 schematically and exemplarily illustrates a section of a vertical cross-section of a power semiconductor device in accordance with one or more embodiments.
Figure 5:
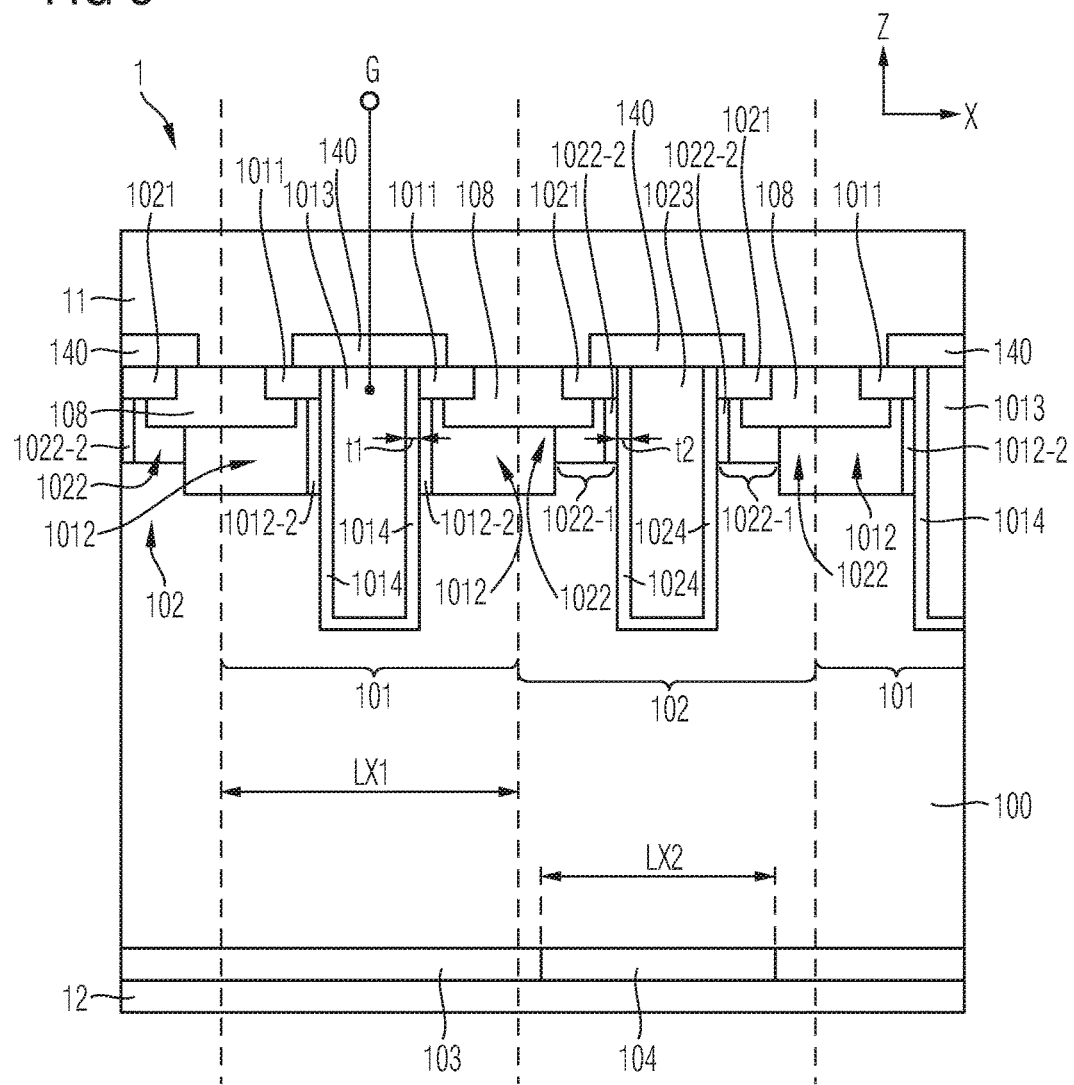
FIG. 5 schematically and exemplarily illustrates a section of a vertical cross-section of a power semiconductor device in accordance with one or more embodiments.

Referring to the embodiments in accordance with FIGS. 2, 5, and 6, at least a portion of the first body region 1012 that includes the first channel region 1021-2 may have a first dopant concentration and at least a portion 1022-1 of the second body region 1022 that includes the second channel region 1022-2 may have a second dopant concentration, wherein the second dopant concentration may be lower than the first dopant concentration. In other words, a channel doping in the second cell 102 may be lower than a channel doping in the first cell 101. For example, the second dopant concentration amounts to at most 50%, such as at most 25%, at most 10%, or even only at most 5% of the first dopant concentration.

As shown in FIGS. 5 to 13, a contact region 108 may be provided within the first body region 1012 and/or within the second body region 1022, wherein the contact region 108 may comprise dopants of the second conductivity type at a higher dopant concentration than portions of the first and/or second body regions 1012, 1022 external of the contact region 108. For example, the contact region 108 may be $p^+$-doped, wherein portions of the first and/or second body regions 1012, 1022 external of the contact region 108 may be at p-doped or $p^-$-doped. The contact region 108 may thus be configured to establish a low ohmic contact with the first load terminal 11. Further, such a contact region 108 may be configured to avoid unintended latching of the power semiconductor device 1 by keeping a lateral voltage drop in operation comparatively low.

Figure 10:
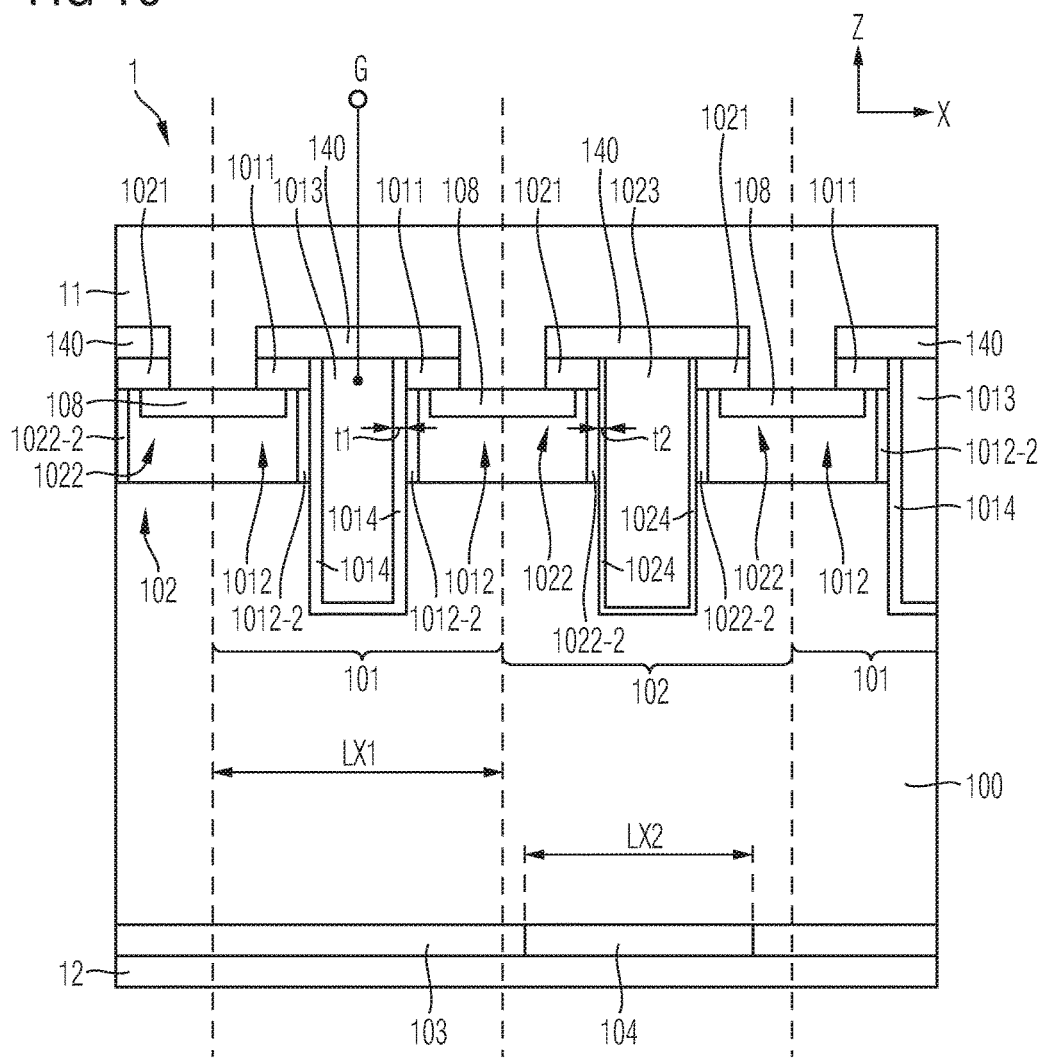
FIG. 10 schematically and exemplarily illustrates a section of a vertical cross-section of a power semiconductor device in accordance with one or more embodiments.

Further, with reference to FIG. 10, the first cell 101 and/or the second cell 102 may comprise a contact groove extending from the front side 10-1 into the semiconductor body Z along the vertical direction Z, wherein at least a part of the first load contact 11, such as a part of a front side metallization, is arranged within the contact groove.

Figure 12:
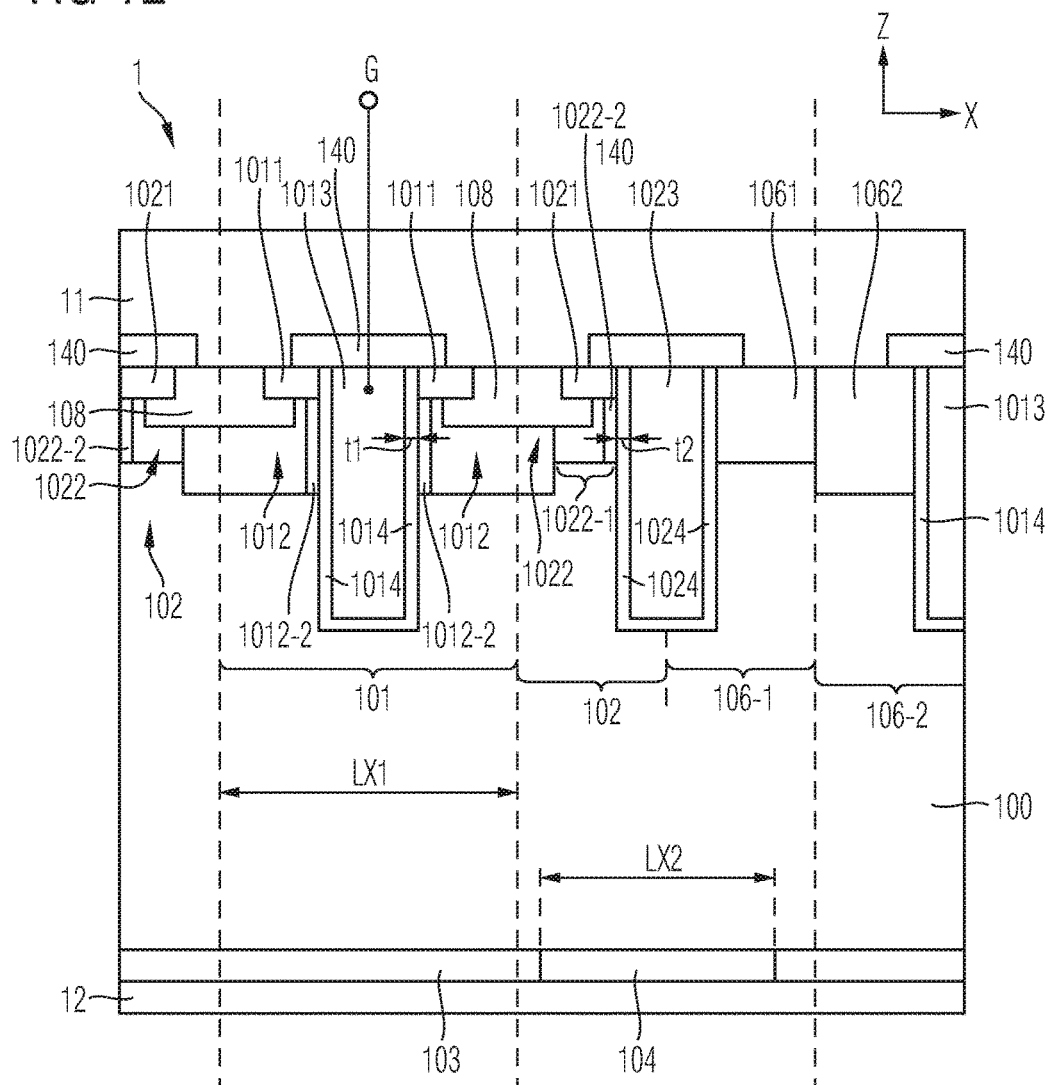
FIG. 12 schematically and exemplarily illustrates a section of a vertical cross-section of a power semiconductor device in accordance with one or more embodiments.

Referring to the embodiment in accordance with FIG. 12, at least one third cell 106-1 and/or at least one fourth cell 106-2 may be arranged at the front side 10-1, wherein the third cell 106-1 and/or the fourth cell 106-2 comprise additional third or fourth emitter regions 1061, 1062, respectively, the third and fourth emitter region 1061, 1062 having dopants of the second conductivity type. With reference to FIG. 12, the third emitter region 1061 may have a lower dopant concentration than the fourth emitter region 10. For example, the third emitter region 1061 is p⁻-doped and the fourth emitter region 1062 is p-doped. For example, a current dependence of an overall emitter efficiency (such as an overall anode efficiency) of a body diode of the power semiconductor device 1 may be adapted by choosing an appropriate ratio of second cells 102 on the one hand and third and/or fourth cells 106-1, 106-2 on the other hand.

Further, the third emitter region 1061 and/or the fourth emitter region 1062 may be configured to induce minority charge carriers (e.g. holes) into the drift region if a current density exceeds a certain value, such as a nominal current density. This is analogous to the locally enhanced backside emitter (LEBE) functionality known in the art.

Figure 13:
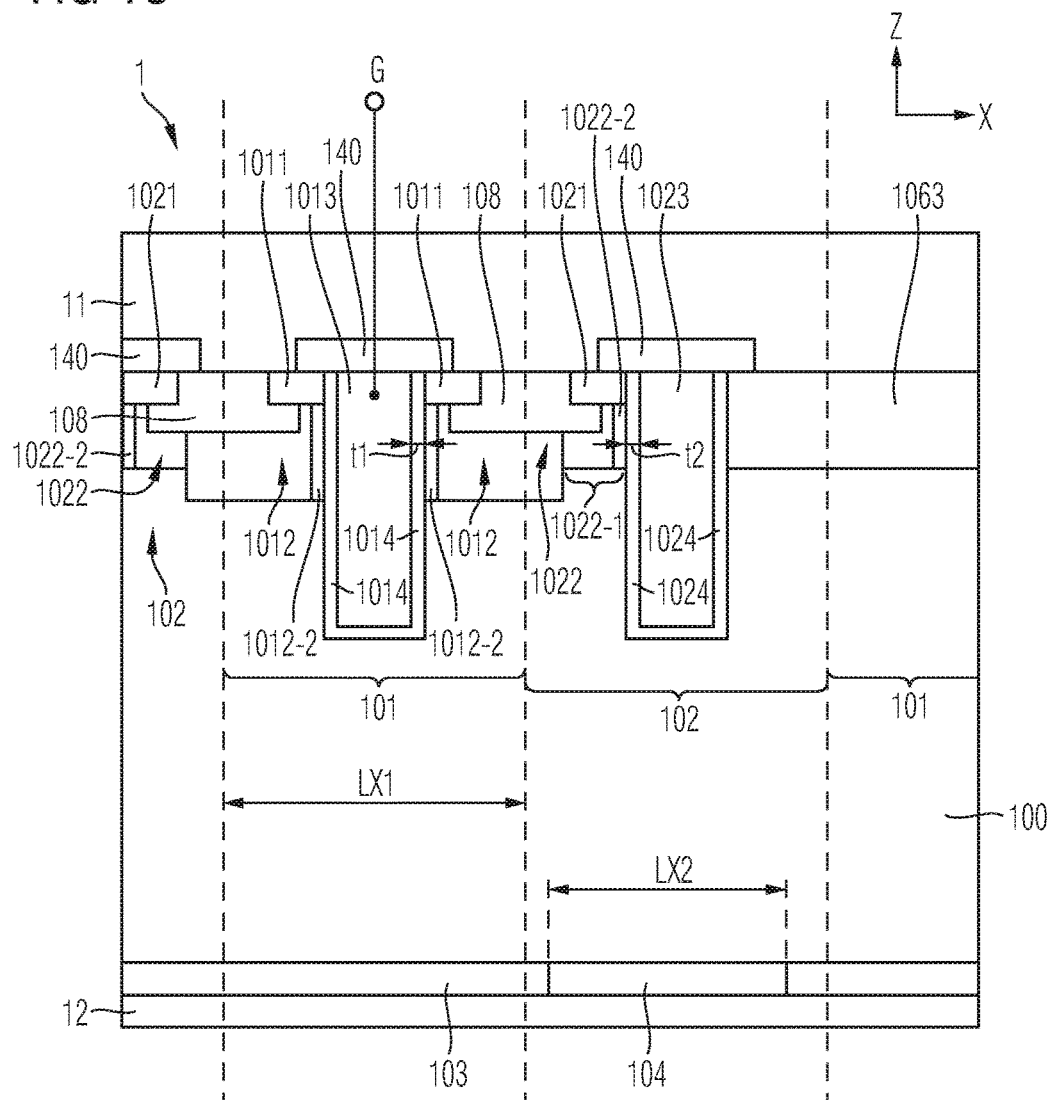
FIG. 13 schematically and exemplarily illustrates a section of a vertical cross-section of a power semiconductor device in accordance with one or more embodiments.

Further, with reference to FIG. 13, in addition to said at least one first cells 101 and said at least one second cells 102 (and possibly third and/or fourth cells 106-1, 106-2), one or more further emitter regions 1063 (such as anode regions) may be provided at the front side 10-1. A lateral extension of the at least one further emitter region 1063, e.g., along the first lateral direction X, may exceed the respective lateral extensions of each first cell 101 and of each second cell 102. For example, such a further emitter region 1063 may have a dopant concentration of the second conductivity type that is different from the respective dopant concentrations of the first body region 1012 and of the second body region 1022.

It should be noted that, in an embodiment, the second backside emitter regions 104 may be aligned with the second cells 102 arranged at the front side 10-1. In other embodiments, the second backside emitter regions 104 may not be aligned with the second cells 102. For example, a lateral extension (e.g. along the first lateral direction X and/or along the second lateral direction Y) of a second backside emitter region 104 may substantially exceed a lateral extension of a second cell 102 arranged at the front side 10-1 opposite to the second back side emitter region 104. Likewise, the first backside emitter regions 103 may be aligned with the first cells 101 arranged at the front side 10-1. In other embodiments, the first backside emitter regions 103 may not be aligned with the first cells 101. For example, a lateral extension (e.g. along the first lateral direction X and/or along the second lateral direction Y) of a first backside emitter region 103 may substantially exceed a lateral extension of a first cell 101 arranged at the front side 10-1 opposite to the first back side emitter region 103.

In an embodiment, the drift region 100 may comprise one or more lifetime reduction regions, e.g., in the vicinity of the pn-junction 107 or completely within the body regions 1012, 1022 and—if present—the emitter regions 1061, 1062. The lifetime reduction regions may be configured to reduce a lifetime of charge carriers. For example, such lifetime reduction regions may have come into being by means of irradiation of the semiconductor body 10-1 with particles at comparatively high energies. Such particles may be irradiated from the front side 10-1 and/or from the backside 10-2 of the semiconductor body 10. For example, by means of an irradiation from the backside 10-2, a first lifetime reduction region may be created in the vicinity of the pn-junction 107 and a second lifetime reduction region may be created such that it extends continuously from the first lifetime reduction region to the backside 10-2 of the power semiconductor device 1.

In an embodiment, a plurality of first cells 101 is clustered in at least one first area of the front side 10-1 of the semiconductor device and a plurality of second cells 102 is clustered in at least one second area of the front side 10-1 of the semiconductor device. Thus, the at least one first area and the at least one second area may form at least one first meta-cell having an IGBT functionality and at least one second meta-cell having an MGD functionality, respectively.

In accordance with another embodiment, a method of processing a power semiconductor device is presented. The method may comprise the following steps: providing a semiconductor body 10 to be coupled to each of a first load terminal 11 being arranged at a front side 10-1 of the semiconductor body 10 and a second load terminal 12 being arranged at a backside 10-2 of the semiconductor body 10; forming in the semiconductor body 10 a drift region 100 having dopants of a first conductivity type; forming a first cell 101 being arranged at the front side 10-1 and comprising: a first source region 1011 being electrically connected with the first load terminal 11; a first body region 1012 included in the semiconductor body 10, the first body region 1012 having dopants of a second conductivity type complementary to the first conductivity type and isolating the first source region 1011 from the drift region 100; and a first electrode 1013 being electrically connected with a first control terminal G of the power semiconductor device 1 and being configured to induce a first inversion channel in a first channel region 1012-2 extending inside the first body region 1012 from the first source region 1011 to the drift region 100; forming a second cell 102 being arranged at the front side 10-1 and comprising: a second source region 1021 included in the semiconductor body 10, the second source region 1021 having dopants of the first conductivity type and being electrically connected with the first load terminal 11; a second body region 1022 included in the semiconductor body 10, the second body region 1022 having dopants of the second conductivity type and isolating the second source region 1021 from the drift region 100; and a second electrode 1023 being electrically insulated from the first control terminal G; forming in the semiconductor body 10 a first backside emitter region 103 being electrically connected with the second load terminal 12 and having dopants of the second conductivity type, wherein the first backside emitter region 103 and the first cell 101 have a first common lateral extension range LX1; and forming in the semiconductor body 10 a second backside emitter region 104 being electrically connected with the second load terminal 12 and having dopants of the first conductivity type, wherein the second backside emitter region 104 and the second cell 102 have a second common lateral extension range LX2.

In accordance with another embodiment, a method of processing a power semiconductor device is presented. The method may comprise the following steps: providing a semiconductor body 10 to be coupled to each of a first load terminal 11 being arranged at a front side 10-1 of the semiconductor body 10 and a second load terminal 12 being arranged at a backside 10-2 of the semiconductor body 10; forming in the semiconductor body 10 a drift region 100 having dopants of a first conductivity type; forming a first cell 101 being arranged at the front side 10-1 and comprising: a first source region 1011 being electrically connected with the first load terminal 11; a first body region 1012 included in the semiconductor body 10, the first body region 1012 having dopants of a second conductivity type complementary to the first conductivity type and isolating the first source region 1011 from the drift region 100; and a first electrode 1013 being electrically connected with a first control terminal G of the power semiconductor device 1 and being configured to induce a first inversion channel in a first channel region 1012-2 extending inside the first body region 1012 from the first source region 1011 to the drift region 100; forming a second cell 102 being arranged at the front side 10-1 and comprising: a second source region 1021 being electrically connected with the first load terminal 11; a second body region 1022 included in the semiconductor body 10, the second body region 1022 having dopants of the second conductivity type and isolating the second source region 1021 from the drift region 100; and a second electrode 1023 being electrically insulated from the first control terminal G; forming in the semiconductor body 10 a first backside emitter region 103 being electrically connected with the second load terminal 12 and having dopants of the second conductivity type, wherein the first backside emitter region 103 and the first cell 101 have a first common lateral extension range LX1; forming in the semiconductor body 10 a second backside emitter region 104 being electrically connected with the second load terminal 12 and having dopants of the first conductivity type, wherein the second backside emitter region 104 and the second cell 102 have a second common lateral extension range LX2; and providing in the drift region 100 a barrier region 100-1 having dopants of the first conductivity type and being arranged in the vicinity of the second body region 1022, wherein a dopant concentration of the barrier region 100-1 is higher than a dopant concentration of a portion of the drift region 100 that is adjacent to the barrier region 100-1.

In an embodiment, forming the first cell 101 and/or forming the second cell 102 may comprise creating a respective trench in the semiconductor body 10 for accommodating the first electrode 1013 or the second electrode 1023. For example, the trench extends from the front side 10-1 into the semiconductor body 10 essentially along the vertical direction Z.

In a variant, in one or both of the methods described above, forming the first cell 101 may comprise forming a first insulation layer 1014 for insulating the first electrode 1013 from the first channel region 1012-2 and forming the second cell 102 may comprise forming a second insulation layer 1024 for insulating the second electrode 1023 from the second channel region 1022-2. For example, forming the first insulation layer 1014 and/or forming the second insulation layer 1024 may comprise at least one of growing an oxide and depositing an oxide. For example, such an oxide may be grown and/or deposited within a respective trench that is created in the semiconductor body 10 for accommodating the first electrode 1013 or the second electrode 1023. In a subsequent process step, the respective trench may be filled with a conductive material, such as a metal or polysilicon, so as to form the first electrode 1013 and/or the second electrode 103.

For example, the first insulation layer 1014 and the second insulation layer 1024 may be formed (e.g. by means of growth and/or deposition of an oxide) within the same process step.

Alternatively, the first insulation layer 1014 and the second insulation layer 1024 may be formed in separate process steps, such as in at least two separate masked deposition steps. Thus, differences between a first permittivity of the first insulation layer 1014 and a second permittivity, as described above, may be achieved, e.g., by using different materials for the insulation layer 1014 and the second insulation layer 1024. Further, differences between a first thickness t1 of the first insulation layer 1014 and a second thickness t2 of the second insulation layer 1024, as described above, may be achieved as a result of the separate process steps.

Further, in an embodiment, said barrier region 100-1 may be arranged in contact with the second body region 1022. However, it should be noted that in other embodiments, the barrier region 100-1 may be arranged in the vicinity of the second body region 1022 without being in contact with said second body region 1022. In an embodiment, the barrier region 100-1 may be arranged "in the vicinity" of the second body region 1022 in the sense that a minimal distance between the barrier region 100-1 and the second body region 1022 is smaller than a minimal distance between the barrier region 100-1 and each of the first backside emitter region 103 and the second backside emitter region 104. For example, said minimal distance between the barrier region 100-1 and the second body region 1022 is smaller than a minimal distance between the barrier region 100-1 and each of the first backside emitter region 103 and the second backside emitter region 104 by a factor of at least 3, such as by a factor of at least 5 or even by a factor of at least 10.

Exemplary ways of implementing the methods presented above may correspond to the embodiments of the power semiconductor device 1 described above and as laid out in the dependent claims. In so far, it is referred to the aforesaid.

The embodiments disclosed above include the recognition that in power semiconductor devices having a reverse conduction capability, such as RC-IGBTs, switching losses that occur upon switching between a reverse-conducting state and a forward-conducting state may be reduced by means of MOS-gated diode (MGD) cells that may be provided at a front side of the semiconductor body, e.g., in parallel to IGBT cells. For example, a self-controlled emitter efficiency (such as a self-controlled anode efficiency) of the body diode may be realized by means of the MGD cells.

In accordance with one or more embodiments, such an MGD cell may be arranged at the front side such that it has a lateral overlap with a second backside emitter region (e.g., an n-short region) that is configured to inject charge carriers (e.g. electrons) in a reverse conducting state of the power semiconductor device. Likewise, an IGBT cell may be arranged at the front side such that it has a lateral overlap with a first backside emitter region (being, e.g., pt-doped) that is configured to inject charge carriers (e.g. holes) in a forward conducting state of the power semiconductor device, i.e., to allow for an IGBT operation. Such an arrangement may allow for an efficient reduction of the emitter efficiency in the reverse conducting state.

In the above, embodiments pertaining to semiconductor device processing methods were explained. For example, these semiconductor devices are based on silicon (Si). Accordingly, a monocrystalline semiconductor region or layer, e.g., the semiconductor body 10, the drift region 100, the substrate 110, the source region 101, the channel region 102 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 110, 101 and 102 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1−x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor device comprising
a semiconductor body having a front side and a backside;
a first load terminal being arranged at the front side and a second load terminal being arranged at the backside;
a drift region being included in the semiconductor body and having dopants of a first conductivity type;
a first cell being arranged at the front side and comprising
a first source region being electrically connected with the first load terminal;
a first body region included in the semiconductor body, the first body region having dopants of a second conductivity type complementary to the first conductivity type and isolating the first source region from the drift region; and
a first electrode being electrically connected with a first control terminal of the power semiconductor device and being configured to induce a first inversion channel in a first channel region extending inside the first body region from the first source region to the drift region;
a second cell being arranged at the front side and comprising
a second source region included in the semiconductor body, the second source region having dopants of the first conductivity type and being electrically connected with the first load terminal;
a second body region included in the semiconductor body, the second body region having dopants of the second conductivity type and isolating the second source region from the drift region; and
a second electrode being electrically insulated from the first control terminal and being configured to induce a second inversion channel in a second channel region extending inside the second body region from the second source region to the drift region;
a first backside emitter region included in the semiconductor body, the first backside emitter region being electrically connected with the second load terminal and having dopants of the second conductivity type, wherein the first backside emitter region and the first cell have a first common lateral extension range; and
a second backside emitter region included in the semiconductor body, the second backside emitter region being electrically connected with the second load terminal and having dopants of the first conductivity type, wherein the second backside emitter region and the second cell have a second common lateral extension range;
wherein:
the first conductivity type is n-type and the first inversion channel is formed if a voltage larger than a positive first threshold voltage is present between the first electrode and the first body region, and the second inversion channel is formed if a voltage larger than a positive second threshold voltage is present between the second electrode and the second body region, the second threshold voltage being smaller than the first threshold voltage, or
the first conductivity type is p-type and the first inversion channel is formed if a voltage smaller than a negative first threshold voltage is present between the first electrode and the first body region, and the second inversion channel is formed if a voltage smaller than a negative second threshold voltage is present between the second electrode and the second body region, the second threshold voltage being larger than the first threshold voltage.

2. The power semiconductor device of claim 1, wherein the drift region comprises a barrier region having dopants of the first conductivity type and being arranged in the vicinity of the second body region, wherein a dopant concentration of the barrier region is higher than a dopant concentration of a portion of the drift region that is adjacent to the barrier region.

3. A power semiconductor device comprising
a semiconductor body having a front side and a backside;
a first load terminal being arranged at the front side and a second load terminal being arranged at the backside;
a drift region being included in the semiconductor body and having dopants of a first conductivity type;
a first cell being arranged at the front side and comprising
a first source region being electrically connected with the first load terminal;
a first body region included in the semiconductor body, the first body region having dopants of a second conductivity type complementary to the first conductivity type and isolating the first source region from the drift region; and
a first electrode being electrically connected with a first control terminal of the power semiconductor device and being configured to induce a first inversion channel in a first channel region extending inside the first body region from the first source region to the drift region;

a second cell being arranged at the front side and comprising
a second source region being electrically connected with the first load terminal;
a second body region included in the semiconductor body, the second body region having dopants of the second conductivity type and isolating the second source region from the drift region; and
a second electrode being electrically insulated from the first control terminal and being configured to induce a second inversion channel in a second channel region extending inside the second body region from the second source region to the drift region;

a first backside emitter region included in the semiconductor body, the first backside emitter region being electrically connected with the second load terminal and having dopants of the second conductivity type, wherein the first backside emitter region and the first cell have a first common lateral extension range; and a second backside emitter region included in the semiconductor body, the second backside emitter region being electrically connected with the second load terminal and having dopants of the first conductivity type, wherein the second backside emitter region and the second cell have a second common lateral extension range, wherein the drift region comprises a barrier region having dopants of the first conductivity type and being arranged in the vicinity of the second body region, wherein a dopant concentration of the barrier region is higher than a dopant concentration of a portion of the drift region that is adjacent to the barrier region; and wherein the first conductivity type is n-type and the first inversion channel is formed if a voltage larger than a positive first threshold voltage is present between the first electrode and the first body region, and the second inversion channel is formed if a voltage larger than a positive second threshold voltage is present between the second electrode and the second body region, the second threshold voltage being smaller than the first threshold voltage, or the first conductivity type is p-type and the first inversion channel is formed if a voltage smaller than a negative first threshold voltage is present between the first electrode and the first body region, and the second inversion channel is formed if a voltage smaller than a negative second threshold voltage is present between the second electrode and the second body region, the second threshold voltage being larger than the first threshold voltage.

4. The power semiconductor device of claim 2, wherein the dopant concentration of the barrier region is higher than the dopant concentration of said portion of the drift region that is adjacent to the barrier region at least by a factor of 100.

5. The power semiconductor device of claim 3, wherein the dopant concentration of the barrier region is higher than the dopant concentration of said portion of the drift region that is adjacent to the barrier region at least by a factor of 100.

6. The power semiconductor device of claim 2, wherein the barrier region is arranged in contact with the second body region.

7. The power semiconductor device of claim 3, wherein the barrier region is arranged in contact with the second body region.

8. The power semiconductor device of claim 1, wherein the absolute value of the second threshold voltage is equal to or smaller than a diffusion voltage of a pn-junction formed at a transition between the drift region and at least one of the first body region and the second body region.

9. The power semiconductor device of claim 1, wherein the absolute value of the second threshold voltage is equal to or smaller than 1 V.

10. The power semiconductor device of claim 1, wherein a capacitance per unit area between the second electrode and the second body region is larger than a capacitance per unit area between the first electrode and the first body region.

11. The power semiconductor device of claim 1, wherein at least a portion of the first body region that includes the first channel region has a first dopant concentration and at least a portion of the second body region that includes the second channel region has a second dopant concentration, the second dopant concentration being lower than the first dopant concentration.

12. The power semiconductor device of claim 11, wherein the second dopant concentration amounts to at most 50% of the first dopant concentration.

13. The power semiconductor device of claim 1, wherein the first electrode is insulated from the first channel region by a first insulation layer having a first permittivity, and wherein the second electrode is insulated from the second channel region by a second insulation layer having a second permittivity, the second permittivity being larger than the first permittivity.

14. The power semiconductor device of claim 1, wherein the first electrode is insulated from the first channel region by a first insulation layer having a first thickness, and wherein the second electrode is insulated from the second channel region by a second insulation layer having a second thickness, the second thickness being smaller than the first thickness.

15. The power semiconductor device of claim 14, wherein said second thickness amounts to at most 50% of said first thickness.

16. The power semiconductor device of claim 1, wherein the second electrode is electrically connected with the first load terminal.

17. The power semiconductor device of claim 1, further comprising a second control terminal being electrically insulated from each of the first load terminal, the second load terminal, and the first control terminal, wherein the second electrode is electrically connected with the second control terminal.

18. The power semiconductor device of claim 1, wherein the first source region is included in the semiconductor body and has dopants of the first conductivity type.

19. The power semiconductor device of claim 1, wherein the power semiconductor device is a reverse conducting IGBT.

20. A method of processing a power semiconductor device, comprising:
providing a semiconductor body to be coupled to each of a first load terminal being arranged at a front side of the semiconductor body and a second load terminal being arranged at a backside of the semiconductor body;
forming in the semiconductor body a drift region having dopants of a first conductivity type;
forming a first cell being arranged at the front side and comprising a first source region being electrically connected with the first load terminal;

a first body region included in the semiconductor body, the first body region having dopants of a second conductivity type complementary to the first conductivity type and isolating the first source region from the drift region; and a first electrode being electrically connected with a first control terminal of the power semiconductor device and being configured to induce a first inversion channel in a first channel region extending inside the first body region from the first source region to the drift region;

forming a second cell being arranged at the front side and comprising a second source region included in the semiconductor body, the second source region having dopants of the first conductivity type and being electrically connected with the first load terminal;

a second body region included in the semiconductor body, the second body region having dopants of the second conductivity type and isolating the second source region from the drift region; and a second electrode being electrically insulated from the first control terminal and being configured to induce a second inversion channel in a second channel region extending inside the second body region from the second source region to the drift region;

forming in the semiconductor body a first backside emitter region being electrically connected with the second load terminal and having dopants of the second conductivity type, wherein the first backside emitter region and the first cell have a first common lateral extension range; and forming in the semiconductor body a second backside emitter region being electrically connected with the second load terminal and having dopants of the first conductivity type, wherein the second backside emitter region and the second cell have a second common lateral extension range;

wherein:

the first conductivity type is n-type and the first inversion channel is formed if a voltage larger than a positive first threshold voltage is present between the first electrode and the first body region, and the second inversion channel is formed if a voltage larger than a positive second threshold voltage is present between the second electrode and the second body region, the second threshold voltage being smaller than the first threshold voltage, or the first conductivity type is p-type and the first inversion channel is formed if a voltage smaller than a negative first threshold voltage is present between the first electrode and the first body region, and the second inversion channel is formed if a voltage smaller than a negative second threshold voltage is present between the second electrode and the second body region, the second threshold voltage being larger than the first threshold voltage.

\* \* \* \* \*